(12) United States Patent
Matsunaga

(10) Patent No.: US 6,506,644 B2
(45) Date of Patent: *Jan. 14, 2003

(54) METHOD OF FABRICATING SEMICONDUCTOR HAVING A REDUCED LEAKAGE CURRENT FLOW BETWEEN THE ACCUMULATION ELECTRODE AND THE GATE ELECTRODE

(75) Inventor: Daisuke Matsunaga, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/228,566

(22) Filed: Jan. 12, 1999

(65) Prior Publication Data

US 2002/0055245 A1 May 9, 2002

Related U.S. Application Data

(62) Division of application No. 09/014,247, filed on Jan. 27, 1998, now Pat. No. 6,392,310.

(30) Foreign Application Priority Data

Jul. 16, 1997 (JP) .............................. 9-191235

(51) Int. Cl.⁷ ......................... H01L 21/8242
(52) U.S. Cl. ...................... 438/253; 438/239; 438/396
(58) Field of Search ............... 438/303, 595, 438/239, 241, 253, 396

(56) References Cited

U.S. PATENT DOCUMENTS 5,811,347 A * 9/1998 Gardner et al. ............. 438/435
5,882,968 A * 3/1999 Jun ............................ 438/254
6,078,079 A * 6/2000 Ogoh ......................... 257/344
6,146,937 A * 11/2000 Hong ......................... 438/239

FOREIGN PATENT DOCUMENTS

| JP | 03050874 A | 3/1991 |
| JP | 6-140368 A | 5/1994 |
| JP | 8-274278 A | 10/1996 |

* cited by examiner

Primary Examiner—Chandra Chaudhari
Assistant Examiner—Jack Chen
(74) Attorney, Agent, or Firm—Armstrong, Westerman & Hattori, LLP

(57) ABSTRACT

A method of fabricating a semiconductor memory device, including a step of forming first and second side wall insulation films which includes the steps of: depositing a first insulation film on the gate electrode such that the first insulation film covers the first and second side walls of the gate electrode; applying a first anisotropic etching process proceeding generally perpendicularly to a principal surface of the substrate, to the first insulation film to form first and second lower side wall insulation films, respectively, on the first and second side walls of the gate electrode in an intimate contact therewith; exposing the first and second lower side wall insulation films to a nitriding atmosphere; depositing a second insulation film on the gate electrode such that the second insulation film covers the first and second lower side wall insulation films; and applying a second anisotropic etching process proceeding generally perpendicularly to the process proceeding generally perpendicularly to the principal surface of the substrate, to the second insulation film to form first and second upper side wall insulation films, respectively, on the first and second lower side wall insulation films.

6 Claims, 16 Drawing Sheets

_US 6,506,644 B2_

METHOD OF FABRICATING SEMICONDUCTOR HAVING A REDUCED LEAKAGE CURRENT FLOW BETWEEN THE ACCUMULATION ELECTRODE AND THE GATE ELECTRODE

This application is a Division of prior application Ser. No. 09/014,247 filed Jan. 27, 1998 now U.S. Pat. No. 6,392,310.

BACKGROUND OF THE INVENTION

1. Field of the Invention

The present invention generally relates to semiconductor devices and, more particularly, to a miniaturized semiconductor device and a fabrication process thereof in which leakage current is minimized.

2. Description of the Related Art

With the continuous progress of device miniaturization, the integration density of semiconductor integrated circuit devices, particularly the integration density of memory semiconductor integrated circuit devices, is increasing every year. These days, intensive investigations are being made on so-called sub-halfmicron devices having a minimum pattern width of 0.3 $\mu$m or less.

In a DRAM (dynamic random access memory) that stores information in a memory cell capacitor in the form of electric charges, the device miniaturization inevitably causes a decrease in the capacitance of the memory cell capacitor, and there is a tendency that the retention of information in the memory cell capacitor becomes unstable. Further, the read/write operation may become also unstable in such extremely miniaturized DRAMs. Similar problems also occur in so-called flash memory devices in which information is stored in a floating gate in the form of electric charges. Thus, various efforts are being made for stabilizing the operation of the miniaturized DRAMs and flash memories.

FIGS. 1A–1F show a conventional fabrication process of a DRAM.

Referring to FIG. 1A, an active region is defined on an Si substrate 1 typically doped to the p-type, by providing a field oxide film 2A and $SiO_2$ on the Si substrate 1, and a thin thermal oxide film 2B also of $SiO_2$ is formed on the active region thus defined on the Si substrate 1 by the field oxide film 2A. Further, a word line WL of polysilicon is provided on the Si substrate 1 so as to extend over the substrate 1 thus covered by the field oxide film 2A and further the thermal oxide film 2B, wherein the word line WL extends over the thermal oxide film 2B in the active region and the word line WL thus extending over the thermal oxide film 2B forms a gate electrode of a memory cell transistor. Thereby, the thermal oxide film 2B forms a gate insulation film of the memory cell transistor.

In the step of FIG. 1A, an ion implantation process of $P^+$ is conducted further into the Si substrate 1 while using the gate electrode 3 as a self-aligned mask, and there are formed diffusion regions 1A and 1B of the memory cell transistor in the Si substrate 1 at both lateral sides of the gate electrode 3.

Next, in the step of FIG. 1B, an oxide film 4 of $SiO_2$ is deposited on the structure of FIG. 1A by a high temperature CVD process so as to cover the gate electrode 3, and an anisotropic etching process acting generally perpendicularly to a principal surface of the substrate 1 is applied to the thermal oxide film 4 in the step of FIG. 1C by an RIE (reactive ion etching) process, to form side wall oxide films 4A and 4B covering both side walls of the gate electrode 3. In the step of FIG. 1C, it is also possible, while not illustrated, to conduct an ion implantation process of $P^+$ while using the gate electrode 3 and further the side wall oxide films 4A and 4B as a self-aligned mask, to form a so-called LDD (lightly-doped drain) structure.

Next, in the step of FIG. 1D, an interlayer insulation film 5 of BPSG (borophosophosilicate glass) is deposited on the structure of FIG. 1C, followed by a formation of a contact hole SA in the interlayer insulation film 5 so as to expose the diffusion region 1A. Further, an electrode 6 is provided as a part of a bit line such that the electrode 6 fills the contact hole 5A and achieves an electrical contact to the exposed diffusion region 1A.

Further, in the step of. FIG. 1E, another interlayer insulation film 7 of BPSG is deposited on the structure of FIG. 1D, followed by a formation of a contact hole 7A penetrating through the interlayer insulation films 7 and 5 such that the contact hole 7A exposes the foregoing diffusion region 1B.

Finally, in the step of FIG. 1F, an accumulation electrode 8A of polysilicon is formed so as to fill the contact hole 7A in electrical contact with the diffusion region 1B, and a dielectric film 8B having a so-called ONO structure, in which a thin SiN film is vertically sandwiched by a pair of thin $SiO_2$ films, is provided so as to cover the accumulation electrode 8A. Further, an opposing electrode 8C of polysilicon is provided so as to cover the foregoing dielectric film 8B. Thereby, the electrode 8A, the dielectric film 8B and the opposing electrode 8C form together a memory cell capacitor 8.

In the DRAM of the foregoing conventional structure, it has been discovered that there are cases in which a leakage current flows between the accumulation electrode 8A and the gate electrode 3 when the DRAM is miniaturized particularly to the degree in which the minimum pattern width is 0.3 $\mu$m or less. As the accumulation electrode 8A forms a part of the memory cell capacitor 8 that holds the information in the form of electric charges, the leakage current occurring in the electrode 8A causes a serious problem in the operation of the DRAM, particularly the stability of data retention. an enlarged scale.

Referring to FIG. 2A, it can be seen that the gate electrode 3 carries an anti-reflection film 3A that has been used for patterning the gate electrode 3. Further, a CVD oxide film 5B is provided between the side wall oxide film 4A or 4B and the interlayer insulation film 5. In order to secure a sufficient distance between the gate electrode 3 and the electrode 8A in the contact hole 5A, the contact hole 5A is formed to have a tapered structure in which the diameter reduces gradually from a top surface to a bottom surface of the contact hole 5A.

In such sub-halfmicron DRAMs having a minimum pattern width of 0.3 $\mu$m or less, it is actually difficult to form the contact hole 5A in the ideally aligned state as shown in FIG. 2A, and actual devices generally have a structure shown in FIG. 2B, in which it will be noted that the contact hole 5A is offset from the ideal state of FIG. 2A. In the structure of FIG. 2B, the accumulation electrode 8A filling the contact hole 5A approaches the gate electrode 3, and it is believed that such a reduction in the distance between the gate electrode 3 and the electrode 8A causes the leakage current to flow between the accumulation electrode 8A and the gate electrode 3, although the exact current path of the leakage current is not fully explored yet.

As will be explained later, the problem of leakage current appears particularly conspicuous when an etching is applied to the diffusion region 1B by a buffered HF solution for removing a oxide film from the surface of the diffusion region 1B.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device having a gate electrode in which leakage current to the gate electrode from an opposing electrode is successfully minimized, as well as a fabrication process thereof.

Another object of the present invention is to provide a semiconductor device., comprising:

a substrate;

a gate electrode provided on said substrate;

a side wall insulation film covering a side wall of said gate electrode;

a diffusion region formed in said substrate adjacent to said gate electrode;

an ohmic electrode formed on said diffusion region; and a nitride film provided between said side wall insulation film and said wall of said gate electrode, such that said nitride film covers a part of a surface of said gate electrode facing said ohmic electrode.

Another object of the present invention is to provide a method of fabricating a semiconductor device, comprising the steps of:

forming a gate electrode on a substrate;

forming a diffusion region in said substrate adjacent to said gate electrode;

forming a side wall insulation film on a side wall of said gate electrode;

depositing an interlayer insulation film on said gate electrode provided with said side wall insulation film;

forming a contact hole in said interlayer insulation film so as to expose a surface of said diffusion region; and forming an ohmic electrode so as to fill said contact hole;

wherein said method further comprises a step, before said step of depositing said interlayer insulation film., of depositing a nitride film such that said nitride film covers at least a part of said gate electrode that faces said ohmic electrode.

According to the present invention, the leakage current path between the gate electrode and the ohmic electrode is successfully interrupted by providing the nitride film such that the nitride film covers a part of the gate electrode that faces the ohmic electrode.

Another object of the present invention is to provide a DRAM, comprising:

a substrate;

a gate electrode provided on said substrate and forming a part of a word line;

a pair of side wall insulation films covering both lateral side walls of said gate electrode;

first and second diffusion regions formed in said substrate at both lateral sides of said gate electrode;

a first interlayer insulation film covering said gate electrode including said pair of side wall insulation films;

a first contact hole formed in said first interlayer insulation film so as to expose said first diffusion region;

a first electrode provided on said first interlayer insulation film so as to fill said first contact hole in contact with said first diffusion region, said first electrode thereby forming a part of a bit line;

a second interlayer insulation film provided on said first interlayer insulation film so as to cover said first electrode;

a second contact hole formed in said second interlayer insulation film so as to penetrate through said first interlayer insulation film, said second contact hole exposing said second diffusion region;

a second electrode provided on said second interlayer insulation film so as to fill said second contact hole in contact with said second diffusion region, said second electrode thereby forming an accumulation electrode of a memory cell capacitor;

a dielectric film provided on a surface of said second electrode as a capacitor electrode of said memory cell capacitor;

a third electrode provided on said dielectric film so as to sandwich said dielectric film therebetween together with said second electrode, said third electrode thereby forming an opposing electrode of said memory cell capacitor; and a nitride film provided so as to cover at least a part of said gate electrode that faces said accumulation electrode.

Another object of the present invention is to provide a method of fabricating a DRAM, comprising the steps of:

forming a gate electrode on a substrate;

forming first and second diffusion regions in said substrate respectively adjacent to a first side wall and a second side wall of said gate electrode;

forming first and second side wall insulation films respectively on said first and second side walls of said gate electrode;

depositing a first interlayer insulation film such that said first interlayer insulation film covers said gate electrode and said first and second side wall insulation films;

forming a first contact hole in said first interlayer insulation film such that said first contact hole exposes said first diffusion region;

forming a bit line pattern on said first interlayer insulation film such that said bit line pattern fills said first contact hole in contact with said first diffusion region;

forming a second interlayer insulation film on said first interlayer insulation film such that said second interlayer insulation film fills said bit line pattern;

forming a second contact hole in said second interlayer insulation film such that said second contact hole penetrates through said first interlayer insulation film and exposes said second diffusion region;

forming an accumulation electrode of a memory cell capacitor such that said accumulation electrode fills said second contact hole and achieves an electrical contact with said second diffusion region;

forming a capacitor insulation film on said accumulation electrode; and forming an opposing electrode on said capacitor electrode;

wherein said method further includes a step, after said step of forming said gate electrode but before said step of forming said first interlayer insulation film, of depositing a nitride film such that said nitride film covers a part of said gate electrode facing said accumulating electrode.

According to the present invention, the current path of the leakage current between the accumulating electrode and the gate electrode is interrupted by providing the nitride film, and the problem of loss of information caused by the dissipation of the electric charges held in the accumulating electrode of the memory cell capacitor is successfully eliminated. Thereby, the DRAM shows an excellent stability of data retention even when the device is miniaturized to a sub-halfmicron size.

Another object of the present invention is to provide a flash memory, comprising:

a substrate;

a gate electrode structure provided on said substrate, said gate electrode structure including: a floating electrode provided on said substrate, said floating electrode being isolated from said substrate by a tunnel insulation film intervening therebetween; and a control electrode provided on said floating electrode with a floating insulation film intervening between said control electrode and said floating electrode, said control electrode thereby forming a part of a word line, said gate electrode structure being defined by a pair of side walls;

a pair of side wall insulation films respectively covering said pair of side walls of said gate electrode structure;

first and second diffusion regions formed in said substrate at both lateral sides of said gate electrode structure;

an interlayer insulation film covering said gate electrode structure including said pair of side wall insulation films;

first and second contact holes formed in said interlayer insulation film so as to expose said first and second diffusion regions respectively;

a first electrode provided on said interlayer insulation film so as to fill said first contact hole in contact with said first diffusion region, said first electrode thereby forming a part of a bit line;

a second electrode provided on said interlayer insulation film so as to fill said second contact hole in contact with said second diffusion region; and a nitride film provided on said gate electrode structure so as to cover at least one of said side walls such that said nitride film intervenes between said wall of said gate electrode structure and corresponding said side wall insulation film.

Another object of the present invention is to provide a method of fabricating a flash memory, comprising the steps of:

forming a tunnel insulation film on a substrate;

forming a gate structure by depositing a floating gate electrode, a floating insulation film and a control gate consecutively on said tunnel insulation film;

forming a diffusion region in said substrate while using said gate structure as a mask;

depositing an interlayer insulation film on said substrate such that said interlayer insulation film covers said gate structure;

forming a contact hole in said interlayer insulation film such that said contact hole exposes said diffusion region; and forming an ohmic electrode on said interlayer insulation film such that said ohmic electrode fills said contact hole in contact with said diffusion region;

wherein said method further comprises a step, after said step of forming said gate electrode but before said step of depositing said interlayer insulation film, of forming a nitride film on said gate structure such that said nitride film covers at least a part of said gate structure facing said electrode.

According to the present invention, the problem of leakage of electric charges from the floating electrode of the gate structure is successfully eliminated by interrupting the leakage current path by providing the nitride film on the side wall of the gate structure.

Another object of the present invention is to provide a semiconductor device comprising:

a substrate, a gate electrode formed on said substrate;

a diffusion region formed in said substrate adjacent to said gate electrode;

an ohmic electrode contacting said diffusion region; and a side wall insulation film formed on a side wall of said gate electrode;

said side wall comprising a first insulation film contacting said side wall of said gate electrode at a side thereof facing said ohmic electrode, and a second insulation film formed on said first insulation film.

Another object of the present invention is to provide a method of fabricating a semiconductor device, comprising:

forming a gate electrode on a substrate;

forming a diffusion region in said substrate adjacent to said gate electrode;

forming a side wall insulation film on a side wall of said gate electrode;

depositing an interlayer insulation film on said gate electrode formed with said side wall insulation film;

forming a contact hole in said interlayer insulation film such that said contact hole exposes said diffusion region; and forming an ohmic electrode such that said ohmic electrode fills said contact hole in electrical contact with said diffusion region;

wherein said step of forming said side wall insulation film comprises the steps of:

forming a first insulation film on said gate electrode such that said first insulation film covers said gate electrode including said side wall;

applying a first anisotropic etching process to said first insulation film such that said first anisotropic etching process proceeds generally perpendicularly to a principal surface of said substrate, a remaining part of said first insulation film forming thereby a first side wall insulation film covering said side wall of said gate electrode;

forming a second insulation film on said gate electrode such that said second insulation film covers said gate electrode including said first side wall insulation film;

applying a second anisotropic etching process to said second insulation film such that said second anisotropic etching process proceeds generally perpendicularly to said principal surface of said substrate, a remaining part of said second insulation film forming thereby a second side wall insulation film covering said first side wall insulation film laterally.

Another object of the present invention is to provide a method of fabricating a semiconductor memory device, comprising the steps of:

forming a gate electrode on a substrate;

forming first and second diffusion regions in said substrate respectively adjacent to first and second side walls of said gate electrode;

forming first and second side wall insulation films respectively on said first and second side walls of said gate electrode;

forming a first interlayer insulation film on said gate electrode such that said first interlayer insulation film covers said first and second side wall insulation films;

forming a first contact hole in said first interlayer insulation film such that said first contact hole exposes said first diffusion region;

forming a bit line pattern on said first interlayer insulation film so as to fill said first contact hole in electrical contact with said first diffusion region;

forming a second interlayer insulation film on said first interlayer insulation film so as to cover said bit line pattern;

forming a second contact hole in said second interlayer insulation film such that said second contact hole penetrates through said first interlayer insulation film and exposes said second diffusion region;

forming an accumulation electrode of a memory cell capacitor such that said accumulation electrode fills said second contact hole and contacts said second diffusion region;

forming a capacitor dielectric film on said accumulation electrode; and forming an opposing electrode on said capacitor dielectric film, wherein said step of forming said first and second side wall insulation films includes the steps of:

depositing a first insulation film on said gate electrode such that said first insulation film covers said first and second side walls of said gate electrode;

applying a first anisotropic etching process proceeding generally perpendicularly to a principal surface of said substrate, to said first insulation film to form first and second, lower side wall insulation films respectively on said first and second side walls of said gate electrode in an intimate contact therewith;

depositing a second insulation film on said gate electrode such that said second insulation film covers said first and second lower side wall insulation films; and applying a second anisotropic etching process proceeding generally perpendicularly to said principal surface of said substrate, to said second insulation film to form first and second, upper side wall insulation films respectively on said first and second lower side wall insulation films.

According to the present invention, the leakage current from the gate electrode is suppressed successfully by forming the side wall insulation film of the gate electrode by two different side wall insulation films.

Other objects and further features of the present invention will become apparent from the following detailed description when read in conjunction with the attached drawings.

DETAILED DESCRIPTION OF THE PREFERRED EMBODIMENTS

Figure 3:
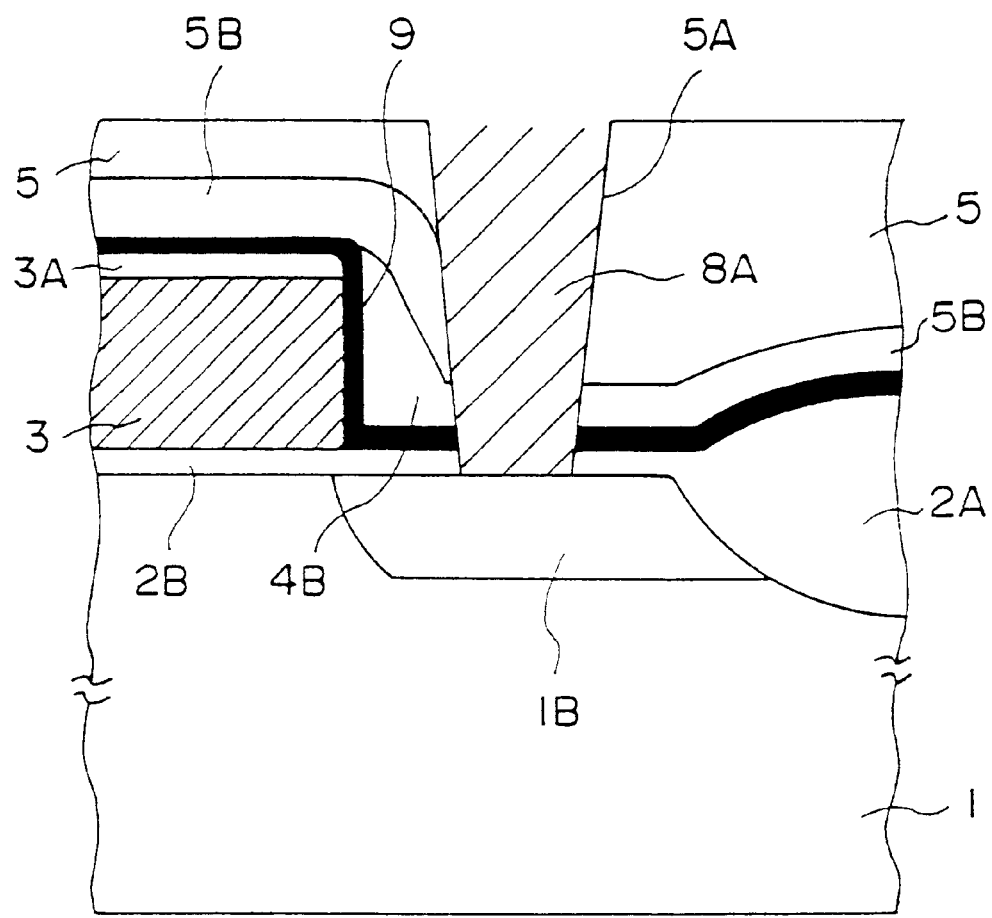
FIG. 3 is a diagram explaining the principle of the present invention.

FIG. 3 shows the principle of the present invention, wherein those parts of FIG. 3 explained previously with reference to preceding drawings are designated by the same reference numerals and the description thereof will be omitted.

Referring to FIG. 3, the present invention uses a SiN film 9 on the gate electrode 3 such that the SiN film 9 covers a top surface of the gate electrode 3 (more precisely the anti-reflection film 3A) as well as a side wall of the gate electrode 3, and the side wall oxide film 4B is provided on the SiN film 9. It should be noted that the SiN film 9 is provided on a thermal oxide film forming an extension of the gate oxide film 2B extending from the side wall of the gate electrode 3 to the contact hole 5A.

By constructing the semiconductor device as indicated in FIG. 3, the leakage current between the accumulation electrode 8A filling the contact hole 5A and the gate electrode 3 is effectively suppressed.

Figure 4A:
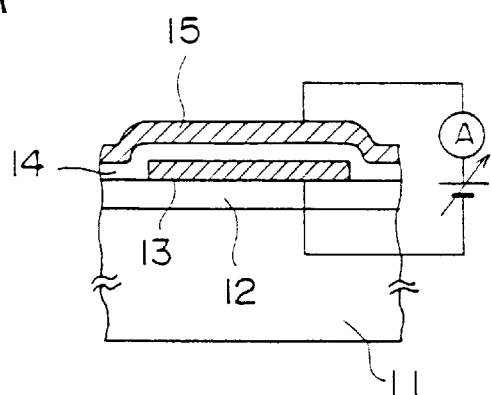
FIGS. 4A and 4B are further diagrams explaining the principle of the present invention.

FIG. 4A shows the experiments conducted on the leakage current occurring in a capacitor formed on a Si substrate 11.

Referring to FIG. 4A, the Si substrate 11 is covered by a thick $SiO_2$ film 12 by a wet oxidation process for example, and a first polysilicon electrode pattern 13 is provided on the $SiO_2$ film 12. Further, an $SiO_2$ film 14 is provided on the polysilicon electrode pattern 13 by a high temperature CVD process with a thickness of about 50 nm such that the $SiO_2$ film 14 covers the polysilicon electrode pattern 13. Further, a second polysilicon pattern 15 is deposited on the $SiO_2$ film 14.

Figure 4B:
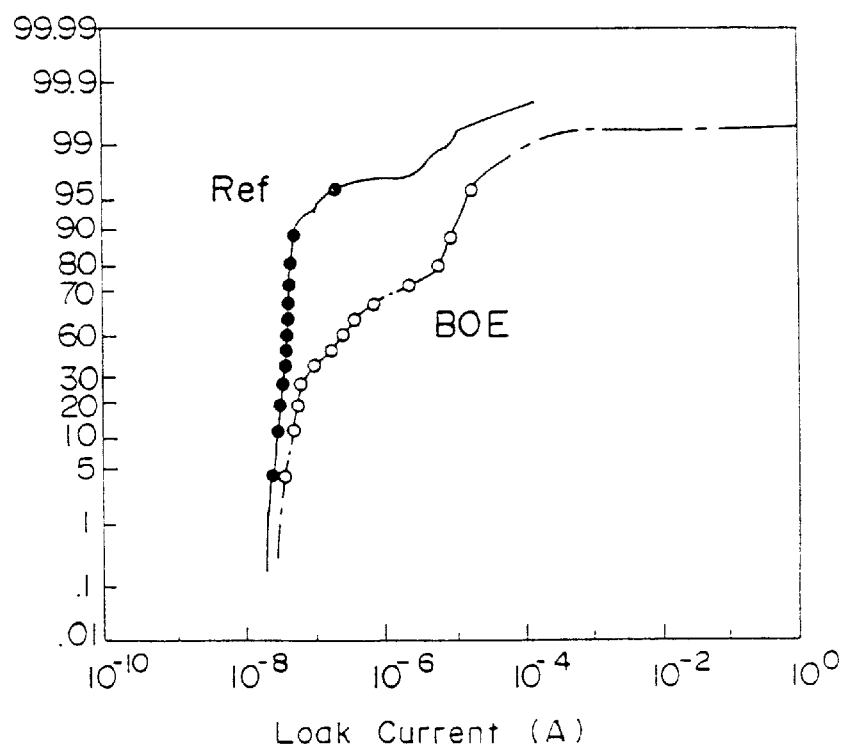

FIG. 4B shows the result of the experiments of FIG. 4A, wherein the horizontal axis of FIG. 4B shows a leakage current while the vertical axis represents the number of specimens that showed a specific leakage current. In FIG. 4B, it should be noted that the solid circles represent the result for a case in which the polysilicon electrode pattern 15 is formed immediately after the formation of the $SiO_2$ film 14, while the open circles represent the result for a case in which the $SiO_2$ film 14 is processed by a buffered HF solution prior to the formation of the electrode pattern 15.

Referring to FIG. 4B, it should be noted that the leakage current is less than $10^{-7}A$ for most of the specimens when the electrode pattern 15 is formed immediately after the formation of the $SiO_2$ film. On the other hand, when the $SiO_2$ film 14 is processed by a buffered HF solution, the number of the specimens that show a leakage current exceeding $10^{-7}A$ increases significantly, in spite of the fact that the thickness of the $SiO_2$ film 14 reduces only 4%, from 50 nm to 48 nm, as a result of the treatment by the buffered HF solution.

Figure 1A:
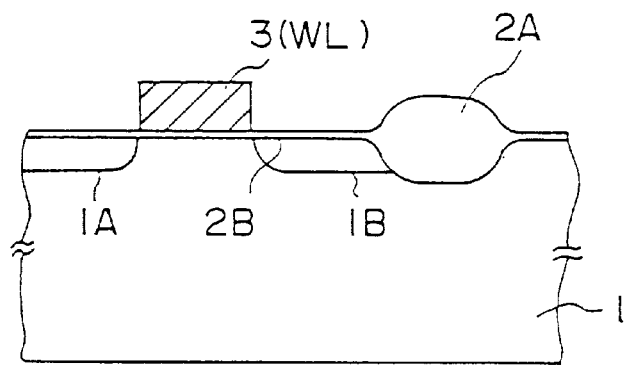
FIGS. 1A–1F are diagrams showing a process of fabricating a conventional DRAM.
Figure 1B:
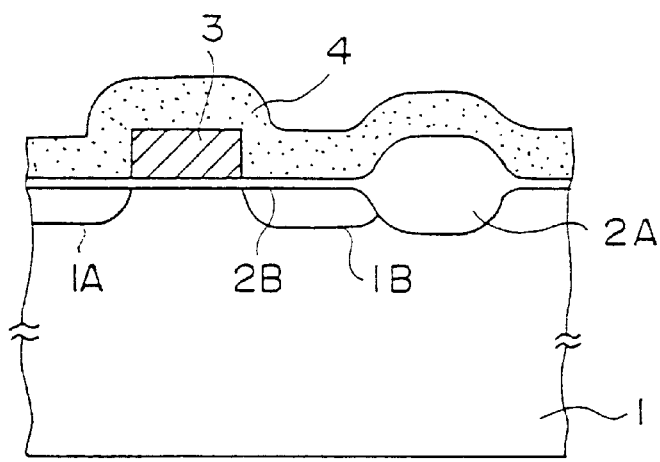
Figure 1C:
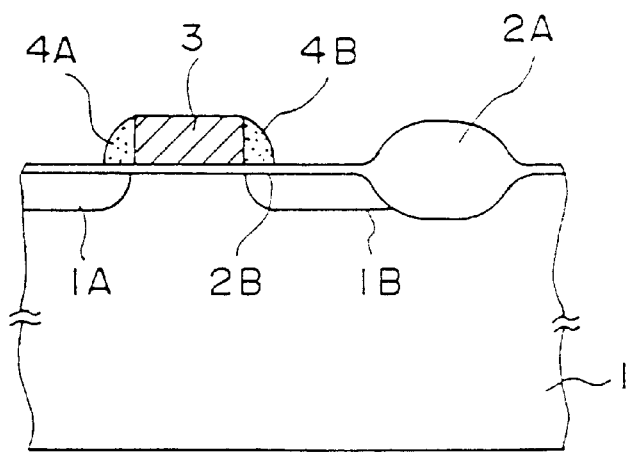
Figure 1D:
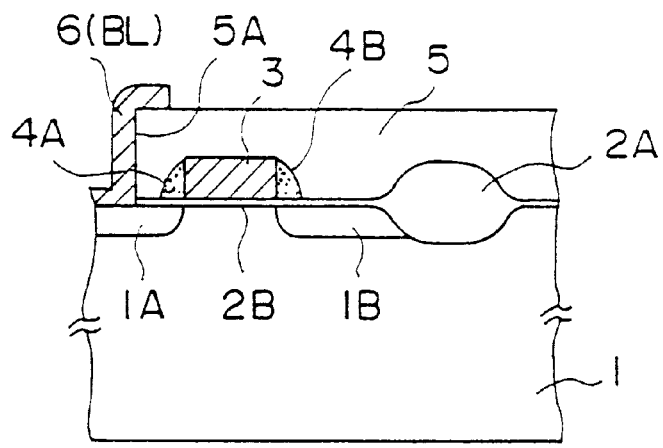
Figure 1E:
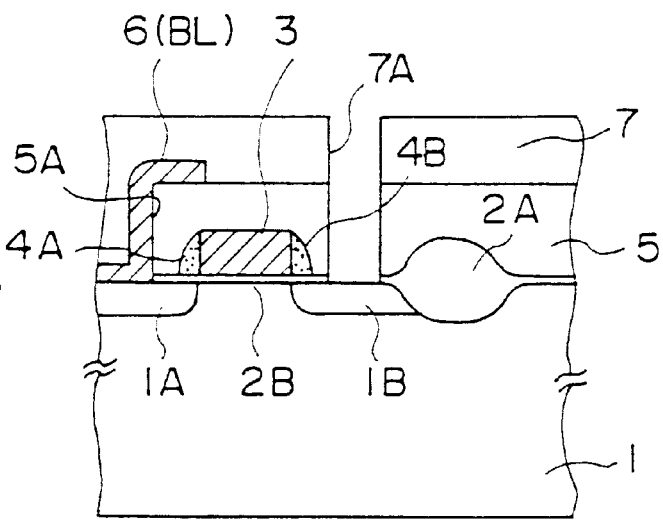
Figure 1F:
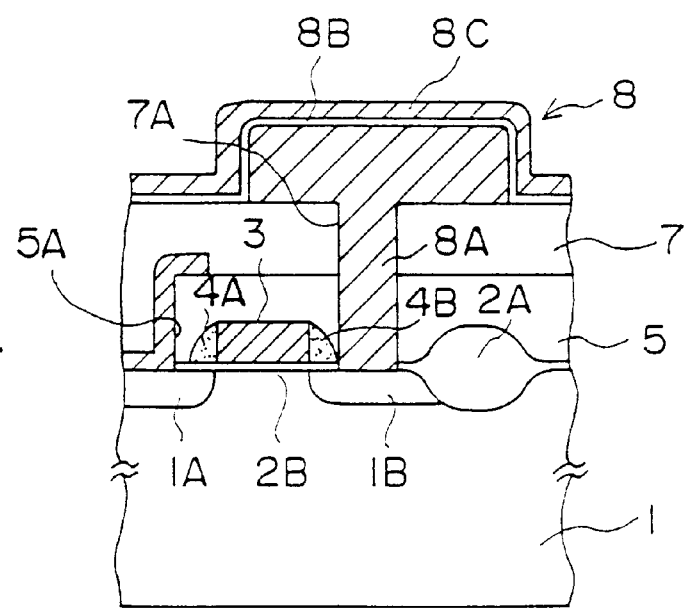
Figure 2A:
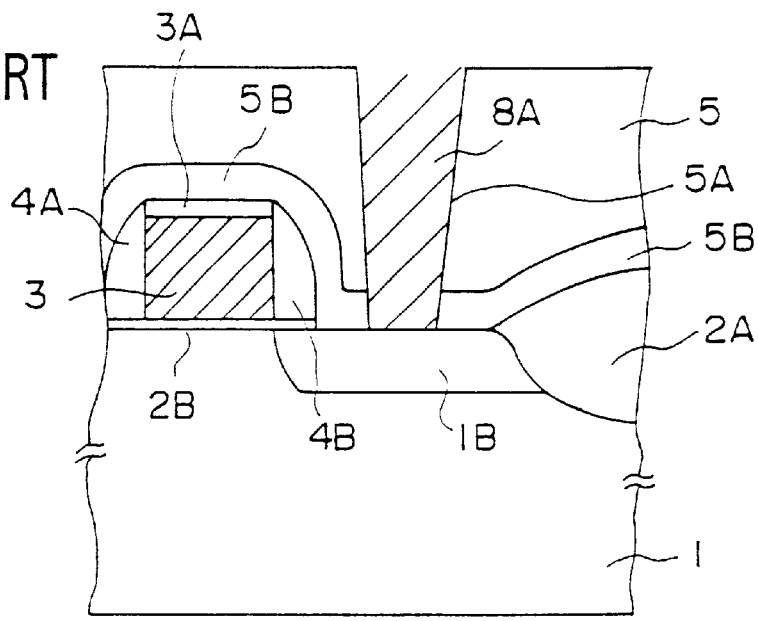
FIGS. 2A and 2B are diagrams explaining the problems pertinent to the conventional DRAM.
Figure 2B:
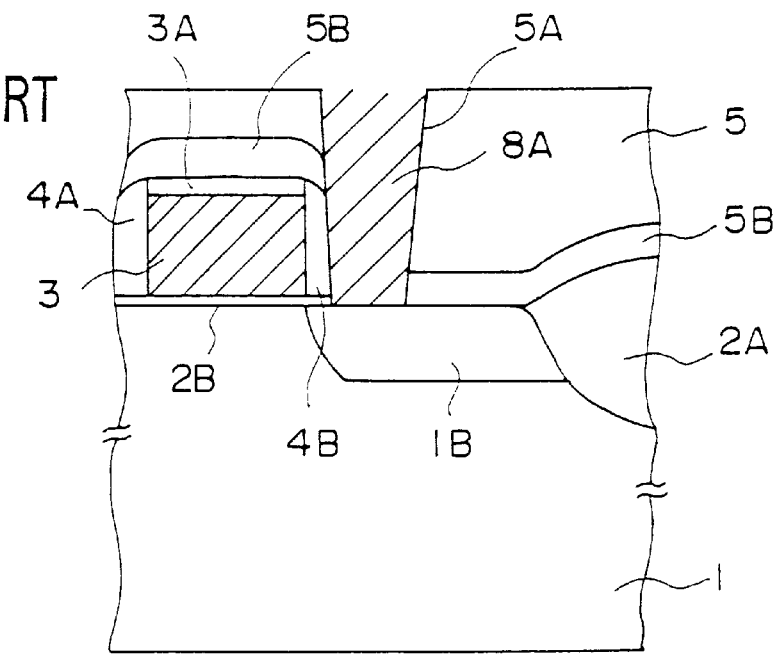

In the structure of FIG. 3 or FIGS. 2A and 2B explained previously, it should be noted that the surface of the diffusion region 1B exposed at the bottom of the contact hole 5A is processed by a buffered HF solution for removing a oxide film therefrom prior to the formation of the accumulation electrode 8A. Thus, the observed deterioration of the leakage current characteristic in the structure of FIGS. 2A and 2B is explained by the result of FIG. 4B.

Figure 5A:
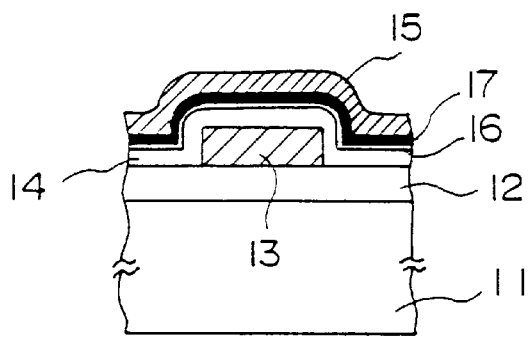
FIGS. 5A and 5B are further diagrams explaining the principle of the present invention.

FIG. 5A shows a similar experiment on the leakage current occurring in a capacitor, in which a stacked structure of an $SiO_2$ film 16 and an SiN film 17 is interposed between the $SiO_2$ film 14 and the polysilicon electrode pattern 15, wherein the $SiO_2$ film 16 and the SiN film 17 are formed by a high temperature CVD process. In the structure of FIG. 5A, a treatment by a buffered HF solution is applied after the formation of the SiN film 17 but before the formation of the polysilicon electrode pattern 15.

Figure 5B:
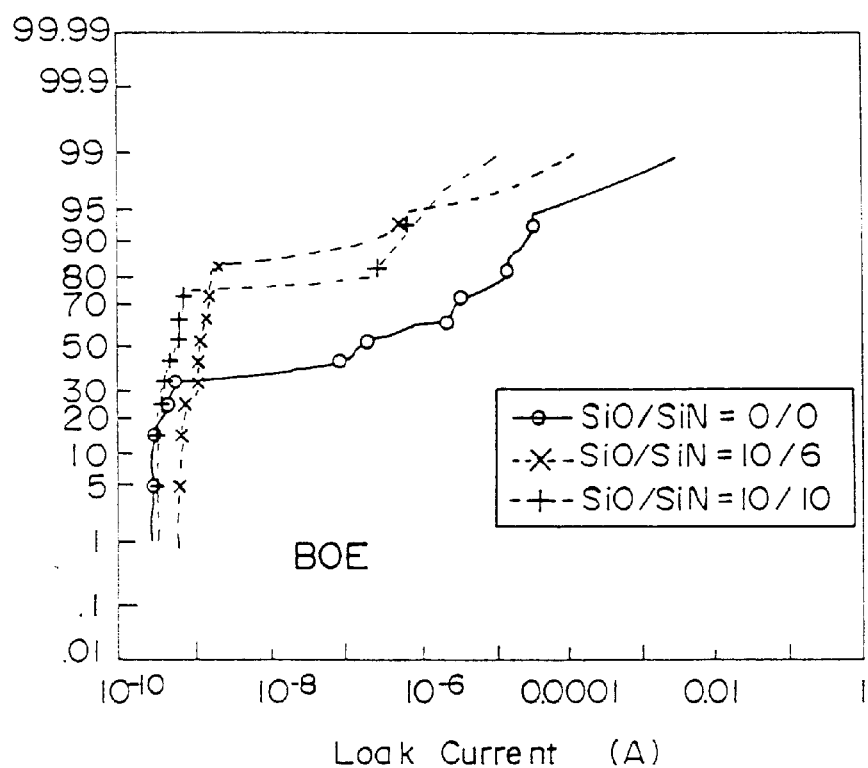

FIG. 5B shows the result of the experiments conducted on the structure of FIG. 5A, wherein the x marks in FIG. 5B show the case in which the thickness of the $SiO_2$ film 16 is set to about 10 nm and the thickness of the SiN film 17 is set to about 6 nm, while the + marks represent the case in which thickness of the $SiO_2$ film 16 and the thickness of the SiN film 17 are both set to 10 nm. Further, the open circles in FIG. 5B represent the case in which no $SiO_2$ film 16 or SiN film 17 is provided. In other words, the open circles represent the result for the structure of FIG. 4B.

Referring to FIG. 5B, it is clearly seen that the leakage current is reduced significantly by forming the SiN film 17 as compared with the case in which no SiN film 17 is formed. In other words, the result of FIG. 5B clearly indicates that the leakage current between the electrode 8A and the electrode 3 is effectively suppressed by providing the SiN film 9.

Figure 6:
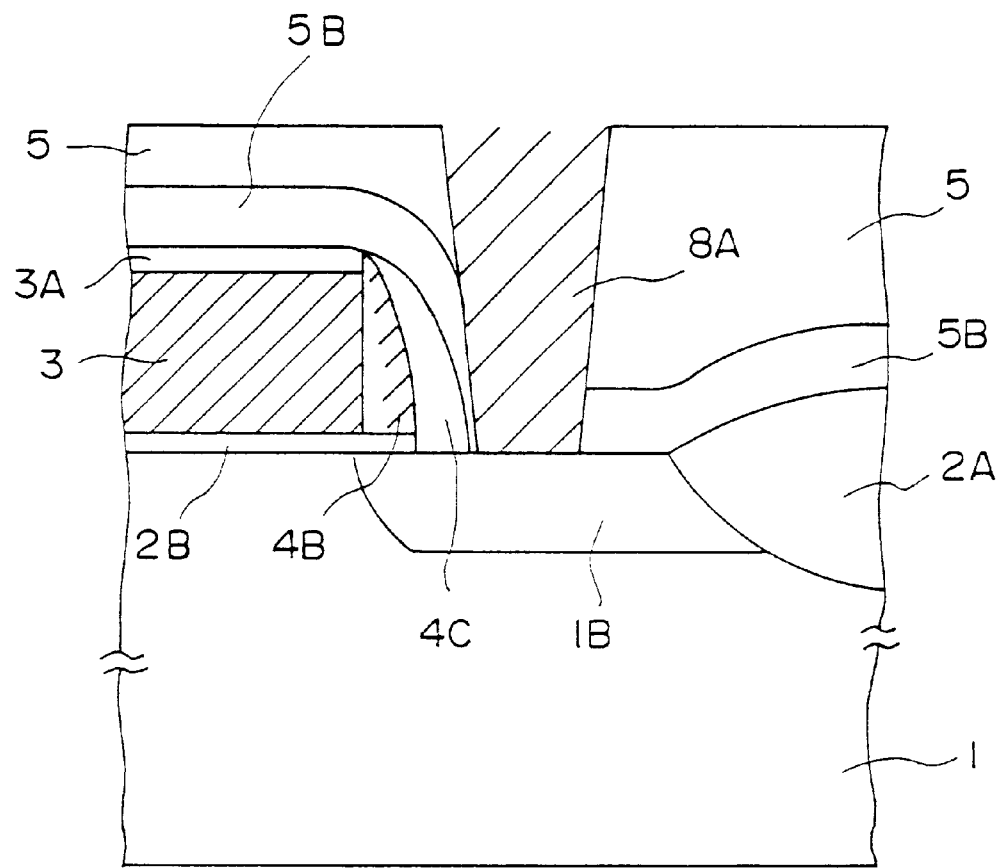
FIG. 6 is a further diagram explaining the principle of the present invention.

FIG. 6 is another diagram showing the principle of the present invention, wherein those parts corresponding to the parts described previously are designated by the same reference numerals and the description thereof will be omitted.

Referring to FIG. 6, another side wall oxide film 4C is provided on the structure of FIG. 2A or 2B such that the side wall oxide film 4C covers an outer lateral side of the side wall oxide film 4B, wherein the side wall oxide film 4C is formed similarly to the side wall oxide film 4B by depositing an $SiO_2$ film on the gate oxide film 3 as well as on the side wall oxide film 4B by a high temperature CVD process, followed by an anisotropic etching process acting substantially perpendicularly to the substrate principal surface. In the foregoing process of forming the structure of FIG. 6, it should be noted that the surface of the side: wall oxide film 4B is processed in an $N_2O$ atmosphere prior to the deposition of the $SiO_2$ film, at a temperature substantially identical to the deposition temperature of the $SiO_2$ film. Thereby, a doped region doped by N is formed on the surface of the side wall oxide film 4A as indicated in FIG. 6 by hatching.

It should be noted that the structure of FIG. 6, using a multilayered structure for the gate side wall oxide film, is also effective for suppressing the leakage current between the electrode 8A and the electrode 3. Of course, the multilayered structure of the gate side wall oxide film is not limited to the two-layer structure shown in FIG. 6 but three or more layer structure may also be employed.

First Embodiment

FIGS. 7A–7G show a fabrication process of a DRAM according to a first embodiment of the present invention.

Figure 7A:
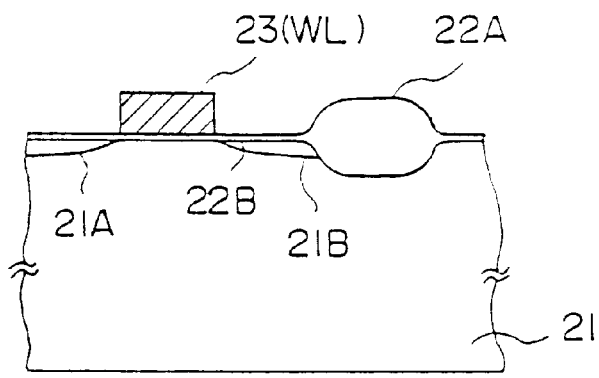
FIGS. 7A–7G are diagrams showing the fabrication process of a DRAM according to a first embodiment of the present invention.

Referring to FIG. 7A, an active region is defined on a Si substrate 21 typically doped to the p-type, by providing a field oxide film 22A of $SiO_2$ on the Si substrate 21, and a thin thermal oxide film 22B also of $SiO_2$ is formed on the active region thus defined on the Si substrate 21 by the field oxide film 22A. Further, a word line WL of polysilicon is provided on the Si substrate 21 so as to extend over the substrate 21 thus covered by the field oxide film 22A and further the thermal oxide film 22B, wherein the word line WL extends over the thermal oxide film 22B in the active region and the word line WL thus extending over the thermal oxide film 22B forms a gate electrode of a memory cell transistor. Thereby, the thermal oxide film 22B forms a gate insulation film of the memory cell transistor.

In the step of FIG. 7A, an ion implantation process of $P^+$ is conducted further into the Si substrate 21 while using the gate electrode 23 as a self-aligned mask, and there are formed diffusion regions 21A and 21B of the memory cell transistor in the Si substrate 21 at both lateral sides of the gate electrode 23.

Figure 7B:
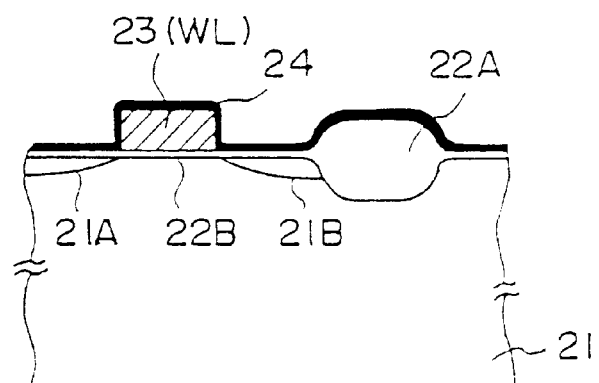
Figure 7C:
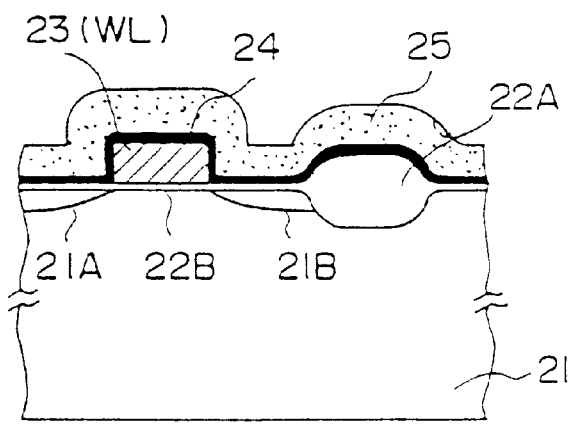

Next, in the step of FIG. 7B, an SiN film 24 is deposited on the structure of FIG. 7A by a CVD process or the like, such that the SiN film 24 covers the top surface as well as both side walls of the gate electrode 23, typically with a thickness of about 30 nm, followed by a deposition of an $SiO_2$ film 25 in a step of FIG. 7C by a high temperature CVD process such that the $SiO_2$ film 25 covers the SiN film 24.

Figure 7D:
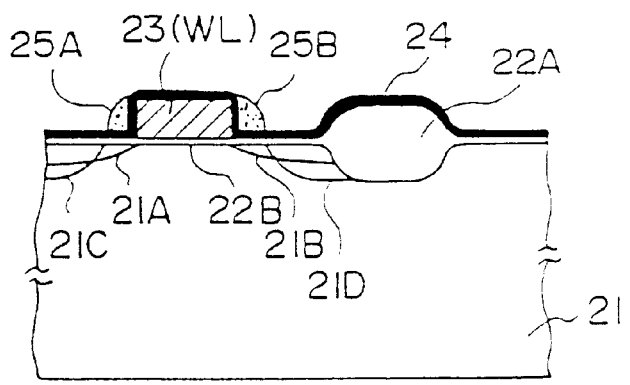

Next, in the step of FIG. 7D, an anisotropic etching process acting generally perpendicularly to a principal surface of the substrate 21 is applied to the $SiO_2$ 25 by an RIE (reactive ion etching) process, to form side wall oxide films 25A and 25B covering the both side walls of the gate electrode 23, with the SiN film 24 intervening therebetween. Further, an ion implantation process of $P^+$ is conducted in the step of FIG. 7D while using the gate electrode 23 and further the side wall oxide films 25A and 25B as a self-aligned mask, to form deeper diffusion regions 21C and 21D respectively in correspondence to the diffusion regions 21A and 21B, wherein the diffusion regions 21A and 21C or the diffusion regions 21B and 21D form together a so-called LDD (lightly-doped drain) structure.

Figure 7E:
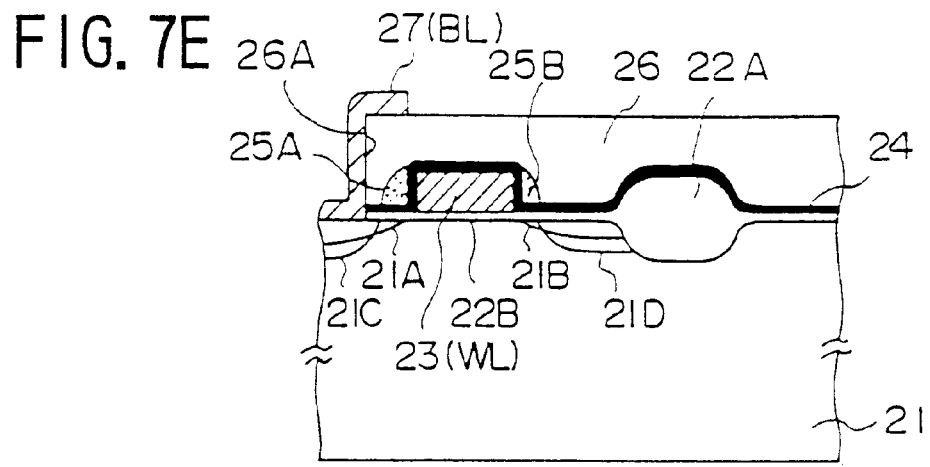

Next, in the step of FIG. 7E, an interlayer insulation film 26 of BPSG (borophosophosilicate glass) is deposited on the structure of FIG. 7D by a CVD process, followed by a formation of a contact hole 26A in the interlayer insulation film 26 so as to expose the diffusion regions 21A and 21C. Further, the exposed surface of the diffusion regions 21A and 21C thus exposed at the bottom of the contact hole 26A is treated by a buffered HF solution to remove a oxide film therefrom, and an electrode 27 is provided as a part of a bit line BL such that the electrode 27 fills the contact hole 26A.

Figure 7F:
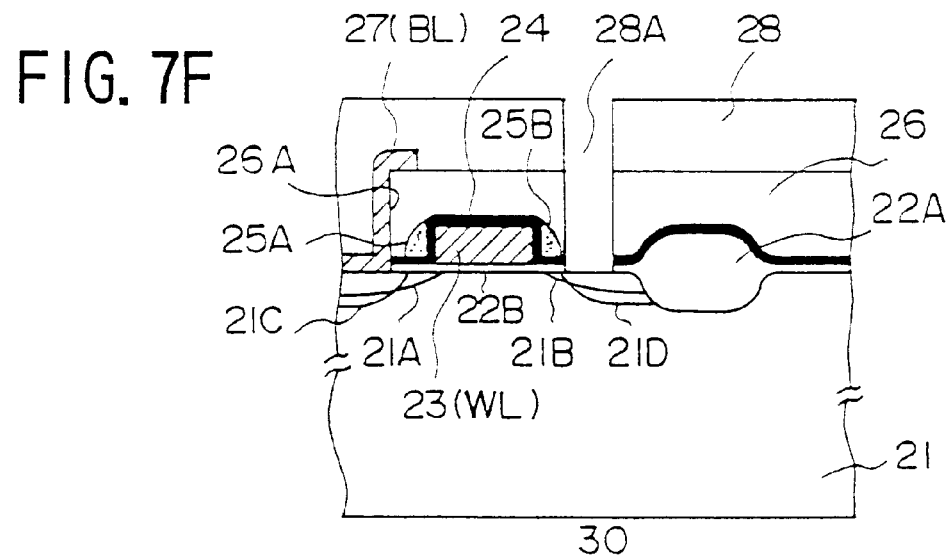

Further, in the step of FIG. 7F, another interlayer insulation film 28 of BPSG is deposited on the structure of FIG. 7E, followed by a formation of a contact hole 28A penetrating through the interlayer insulation films 26 and 28 such that the contact hole 28A exposes the foregoing diffusion region 21B (as well as the diffusion region 21D).

Figure 7G:
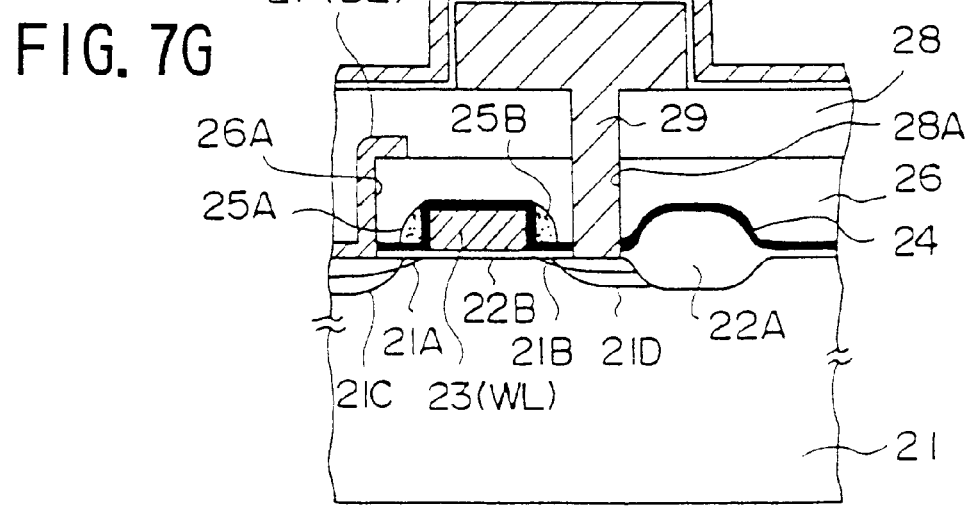

Finally, in the step of FIG. 7G the surface of the diffusion region exposed at the bottom of the contact hole 28A is processed by a buffered HF solution for removal of a oxide film therefrom, and a polysilicon electrode 29 forming the accumulation electrode of the memory cell capacitor is provided on the structure of FIG. 7F in contact with the diffusion regions 21B and 21D, such that the polysilicon electrode 29 fills the contact hole 28A. Further, a dielectric film 30 having a so-called ONO structure, in which a thin SiN film is vertically sandwiched by a pair of thin $SiO_2$ films, is provided so as to cover the accumulation electrode 29. Further, an opposing electrode 31 of polysilicon is provided so as to cover the foregoing dielectric film 30. Thereby, the electrode 29, the dielectric film 30 and the opposing electrode 31 form together a memory cell capacitor.

In the DRAM thus formed, the SiN film 24 interposed between the polysilicon electrode 29 filling the contact hole 28A and the gate electrode 23 effectively prevents the leakage current flowing between the polysilicon electrode 29 and the gate electrode 23 even in such a case in which the exposed surface of the diffusion region is processed by an etching treatment caused by the buffered HF solution for removal of the oxide film therefrom. See the relationship of FIG. 5B. Thereby, the SiN film 24, having a very small thickness and extending only over the thermal oxide film that forms an extension of the gate insulation film 22B, does not induce any stress or strain to the essential part of the semiconductor device such as the channel region or diffusion regions, and the operation of the semiconductor device is not deteriorated at all.

It should be noted that the present embodiment for fabricating a DRAM is effective also for a DRAM that has a self-aligned contact structure disclosed in the Japanese Laid-Open Patent Publication 8-274278). In such a case, the contact hole 28A can be formed by using the side wall oxide films 25A and 25B as a self-aligned mask.

Second Embodiment

FIGS. 8A–8G show a fabrication process of a flash memory according to a second embodiment of the present invention.

Figure 8A:
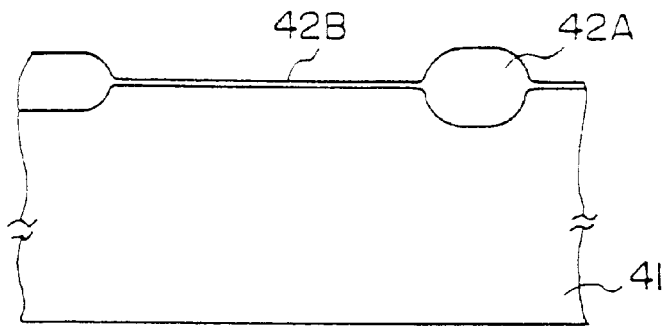
FIGS. 8A–8G are diagrams showing the fabrication process of a flash memory according to a second embodiment of the present invention.

Referring to FIG. 8A, a Si substrate 41 typically doped to the p-type is covered by a field oxide film 42A of $SiO_2$ such that the field oxide film 42A defines an active region on the surface of the Si substrate 41, wherein the active region is covered by a thin thermal oxide film 42B also of $SiO_2$.

Figure 8B:
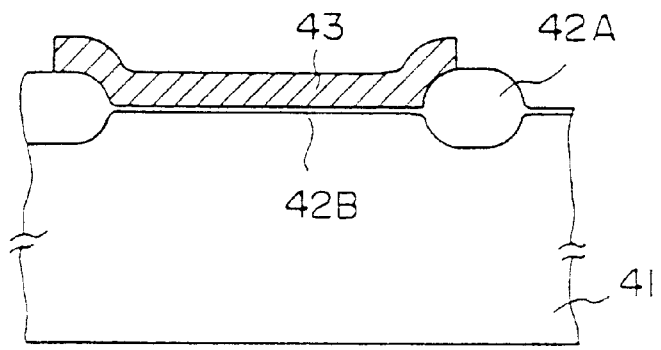

Next, in the step of FIG. 8B, a polysilicon pattern 43 is provided on the thermal oxide film 42B such that the polysilicon pattern 43 extends over the foregoing active region on the Si substrate 41. It should be noted that the thermal oxide film 42B acts as a tunnel oxide film of the flash memory to be formed, while the polysilicon pattern 43 forms a part the floating gate.

Figure 8C:
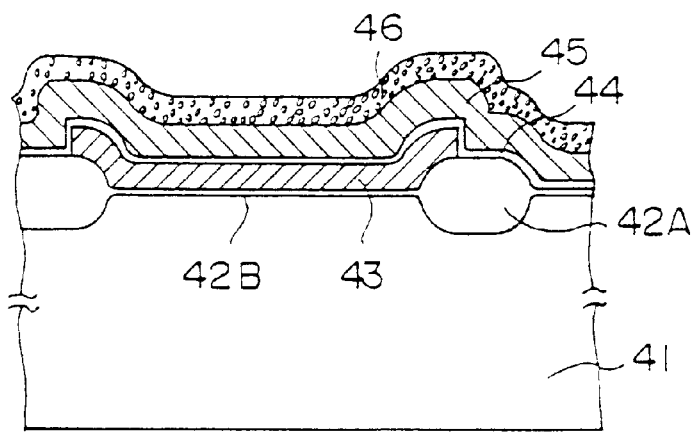
Figure 8D:
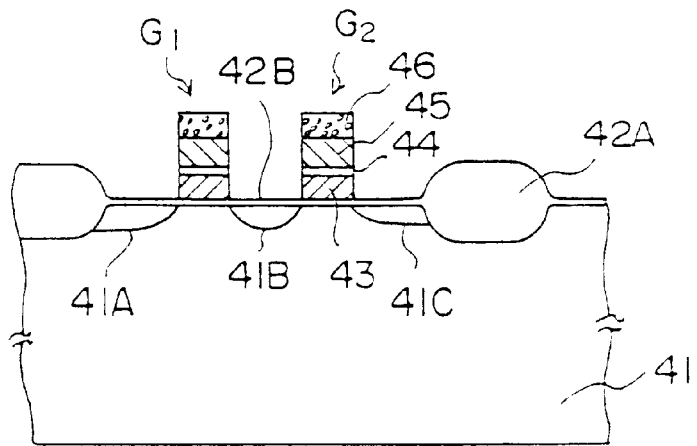

Next, in the step of FIG. 8C, a dielectric film 44 of SiON is provided on the structure of FIG. 8B such that the dielectric film 44 covers the top surface as well as the side walls of the polysilicon pattern 43, followed by consecutive depositions of a polysilicon film 45 and a WSi film 46 as indicated in FIG. 8C, wherein the structure of FIG. 8C is subjected to a patterning process in the step of FIG. 8D to form gate electrode structures $G_1$ and $G_2$ each having a stacked structure of polysilicon layer 43, the SiON layer 44, the polysilicon layer 45 and the WSi layer 46. As noted already, the polysilicon layer 43 acts as the floating gate of the flash memory while the polysilicon layer 45 and the WSi layer 46 form the control electrode.

In the step of FIG. 8D, an ion implantation process of $P^+$ or $As^+$ is further conducted into the substrate 41 while using the gate electrode structures $G_1$ and $G_2$ as a self-aligned mask, and diffusion regions 41A, 41B and 41C are formed in the substrate 41 as a result of the ion implantation process.

Figure 8E:
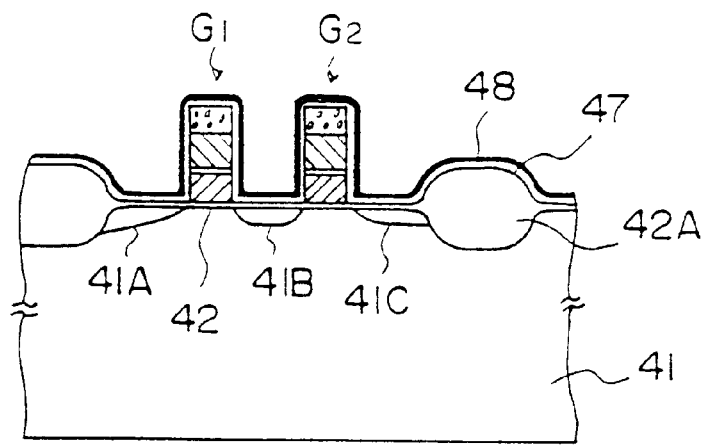

Next, in the step of FIG. 8E, an $SiO_2$ film 47 and an SiN film 48 are deposited consecutively on the structure of FIG. 8D by a high temperature CVD process, such that the $SiO_2$ film 47 and the SiN film 48 cover each of the gate electrode structure $G_1$ and the gate electrode structure $G_2$ continuously including the top surface and both side walls.

Figure 8F:
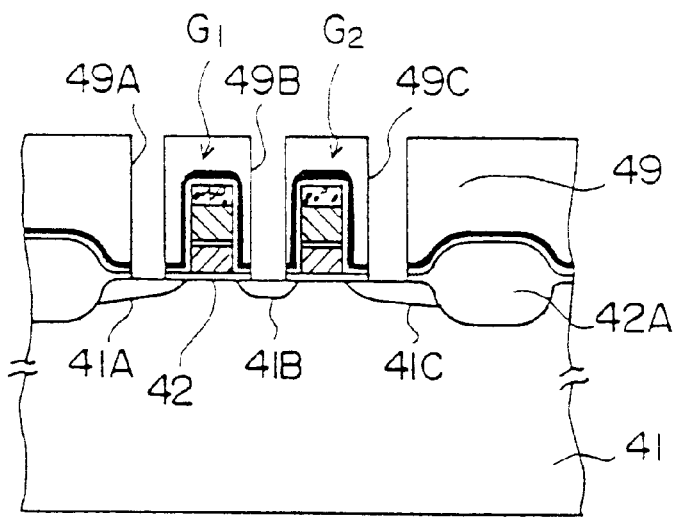
Figure 8G:
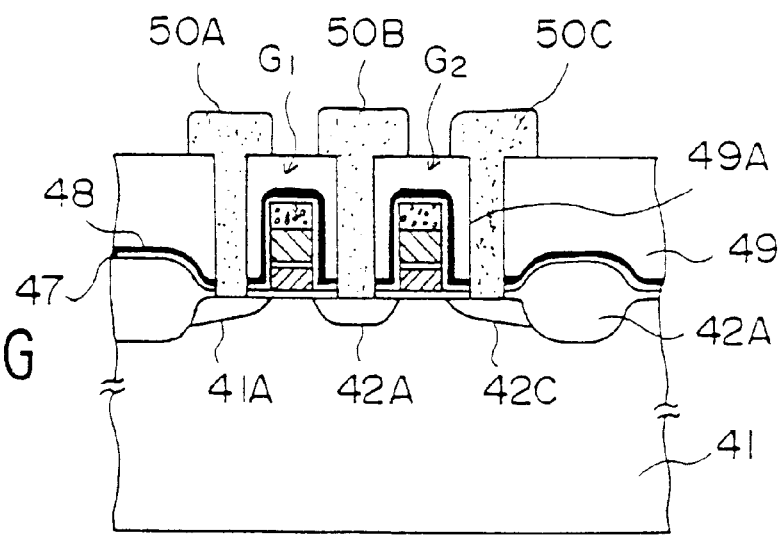

Next, in the step of FIG. 8F, an interlayer insulation film 49 of BPSG is deposited on the structure of FIG. 8E such that the interlayer insulation film 49 covers the gate electrode structures $G_1$ and $G_2$, and contact holes 49A–49C are formed in the interlayer insulation film 49 thus formed so as to expose the diffusion regions 41A–41C respectively.

After the contact holes 49A–49C are thus formed, a wet etching process is applied to the structure of FIG. 8F by using a buffered HF solution, and any oxide films remaining on the surface of the diffusion regions 41A–41C exposed by the contact holes 49A–49C are removed. After the foregoing etching process, ohmic electrodes 50A–50C are formed on the interlayer insulation film 49 such that the ohmic electrodes 50A–50C fill the contact holes 49A–49C respectively, wherein the ohmic electrode 50A or 50C forms a part of a bit line BL while the ohmic electrode 50B are connected to an erasing voltage source together with the corresponding ohmic electrodes of other memory cell transistors. Further, the suicide layer 46 in the gate electrode stricture G, or $G_2$ is connected to a word line WL as a part of the control electrode.

In the flash memory having such a structure, the gate electrode structure $G_1$ or $G_2$ is covered continuously by the SiN film 48. Thereby, the problem of leakage of the electric charges from the floating gate electrode 43 to an adjacent electrode such as the electrode 50A is effectively suppressed even in such a case in which the electrode 50A is formed in the vicinity of the floating gate electrode 43, and a reliable holding of information becomes possible for the flash memory.

Modifications

Figure 9A:
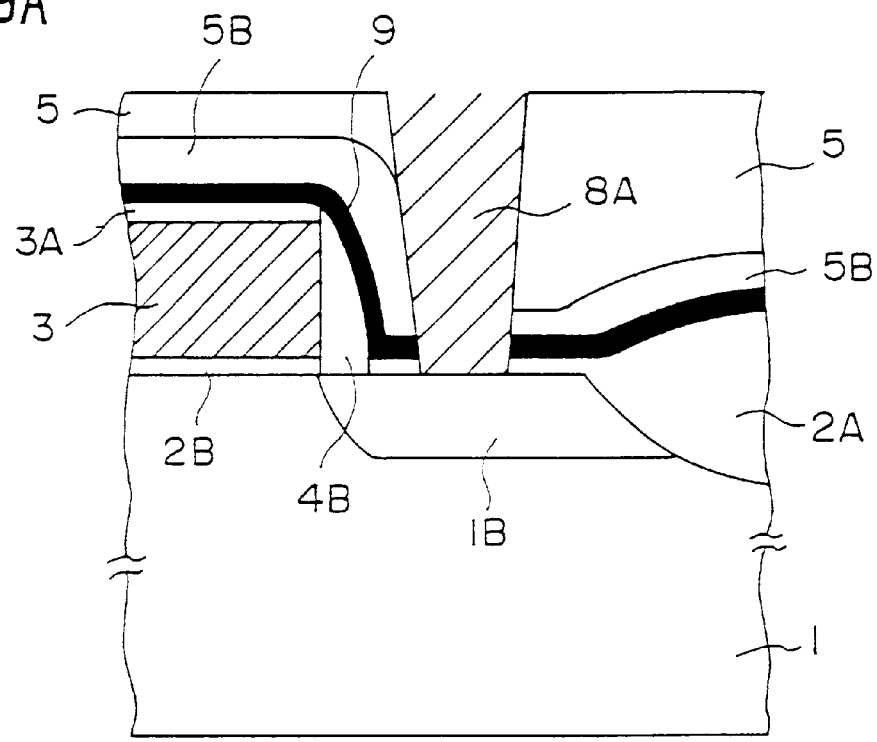
FIGS. 9A and 9B are diagrams showing a modification of the first embodiment of the present invention.
Figure 9B:
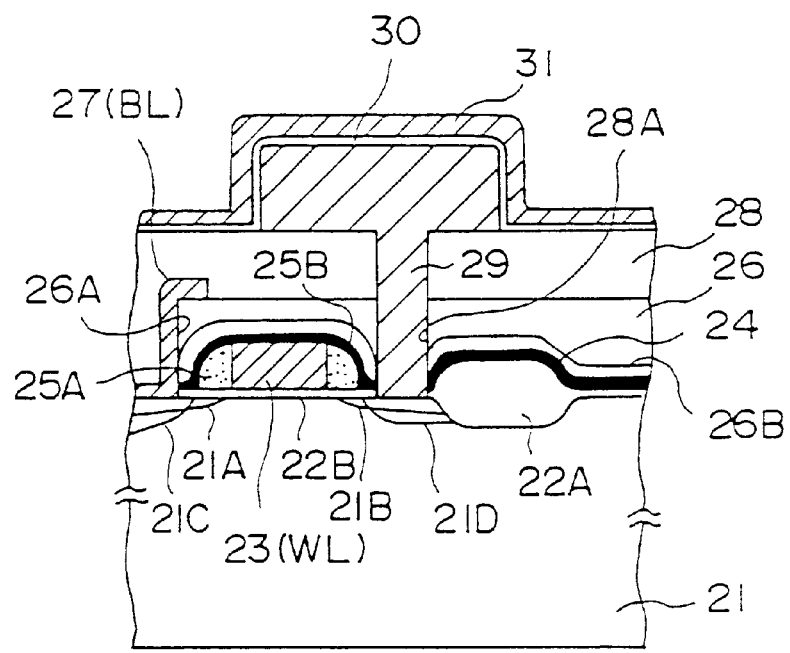

FIGS. 9A and 9B show modifications of the first embodiment that uses an SiN film in a DRAM for suppressing the leakage current, wherein those parts of FIGS. 9A and 9B corresponding to the parts described previously are designated by the same reference numerals and the description thereof will be omitted.

The structure of FIG. 9A is a modification of the construction of FIG. 3 and includes the SiN film 9 such that the SiN film 9 covers the side wall insulation film 4B rather than contacting the side wall of the gate electrode 3 directly. In such a construction, too, it should be noted that the SiN film 9 covers a part of the gate electrode 3 facing the ohmic electrode 8 and effectively interrupts the leakage current between the electrode 8A and the electrode 3.

In the modification of FIG. 9B, the structure of the DRAM of FIG. 7G is modified such that the SiN film 24 extends on the side wall oxide films 25A and 25B rather than contacting the side wall of the gate electrode 23 directly. In such a structure, too, the SiN film 24 covers a part of the gate electrode 23 facing the accumulation electrode 29, and the leakage current between the gate electrode 23 and the accumulation electrode 29 is effectively interrupted.

Third Embodiment

FIGS. 10A–10I are diagrams showing a fabrication process of a DRAM according to a third embodiment of the present invention.

Figure 10A:
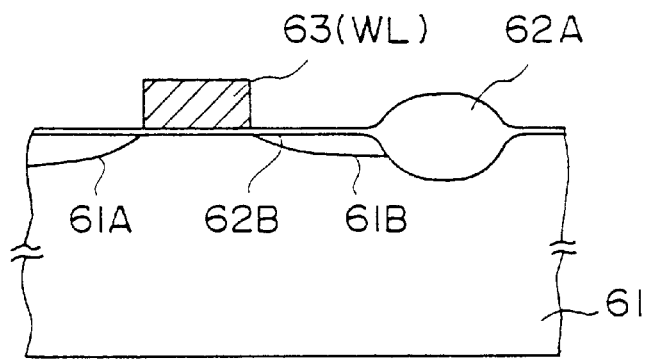
FIGS. 10A–10I are diagrams showing the fabrication process of a DRAM according to a third embodiment of the present invention.

Referring to FIG. 10A, a Si substrate 61 typically doped to the p-type is covered by a field oxide film 62A of $SiO_2$ such that the field oxide film 62A defines an active region on the surface of the substrate 61, and a thermal oxide film is formed on the active region thus defined. Further, a word line WL of polysilicon is provided such that the polysilicon word line WL extends over the substrate 61 covered by the field oxide film 62A or thermal oxide film 62B. The word line WL extends over the surface of the substrate 61 thus covered by the field oxide film 62A or the thermal oxide film 62B. Thereby, the thermal oxide film 62B acts as a gate insulation film of the memory cell transistor.

In the step of FIG. 10A, an ion implantation process of $P^+$ is conducted further into the substrate 61 while using the gate oxide film 63 as a self-aligned mask, to form diffusion regions 61A and 61B of the memory cell transistor at both lateral sides of the gate electrode 63.

Figure 10B:
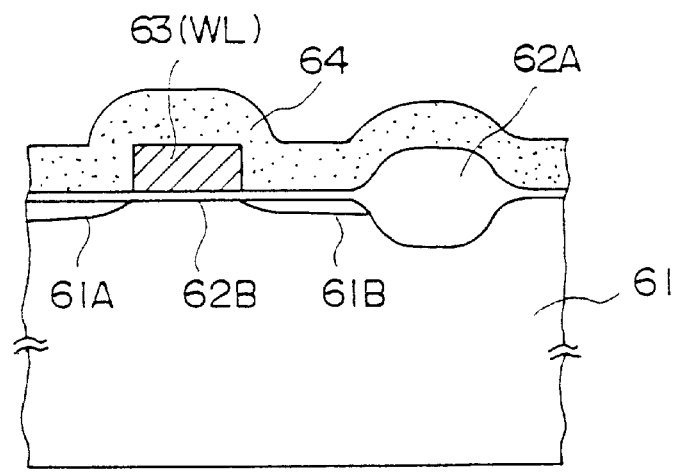

Next, in the step of FIG. 10B, an $SiO_2$ film 64 is deposited on the structure of FIG. 10A by a high temperature CVD process, such that the $SiO_2$ film 64 covers the top surface as well as both lateral side walls of the gate electrode 63.

Figure 10C:
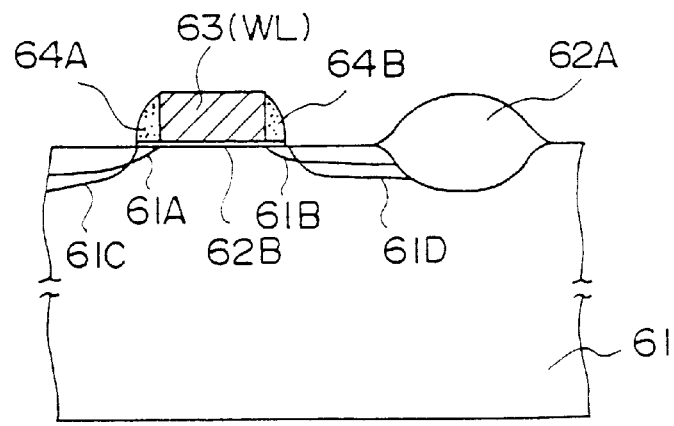

Next, in the step of FIG. 10C, an anisotropic etching process is applied to the $SiO_2$ film 64 in a direction generally perpendicularly to a principal surface of the substrate 61, to form side wall oxide films 64A and 64B on both side walls of the gate electrode 63. Further, an ion implantation process of $P^+$ or $As^+$ is conducted in the step of FIG. 10C to form deeper diffusion regions 61C and 61D in the substrate 61 respectively in a partially overlapped relationship with the shallower diffusion regions 61A and 61B. Thereby, the diffusion region 61A and the diffusion region 61C or the diffusion region 61B and the diffusion region 61D form an LDD structure.

Figure 10D:
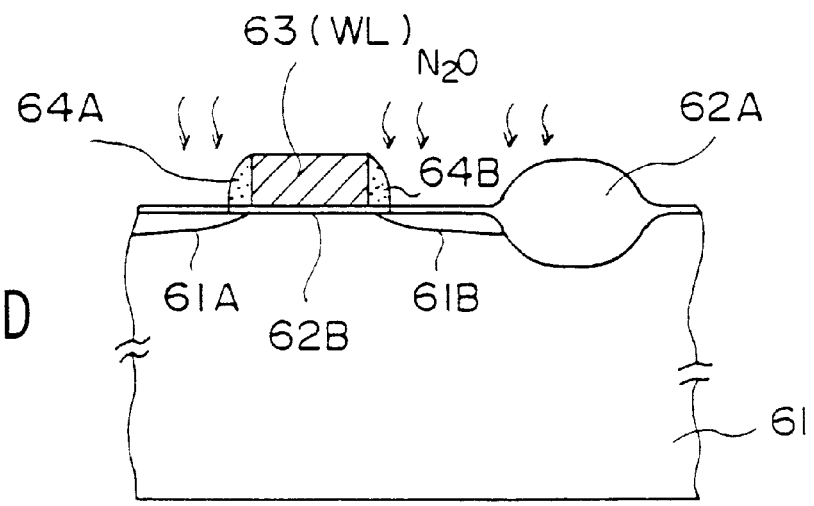

It should be noted that the anisotropic etching process in the step of FIG. 10C is carried out in the same deposition apparatus used for depositing the $SiO_2$ film 64, without taking out the substrate 61 from the deposition apparatus, wherein the structure of FIG. 10C thus obtained is then exposed, in a step of FIG. 10D, to an $N_2O$ atmosphere in the same deposition apparatus at a temperature substantially identical to the temperature used in the foregoing deposition apparatus for depositing an $SiO_2$ film by a high temperature CVD process. Thereby, the exposed surfaces of the side wall oxide films 64A and 64B are doped by N.

Figure 10E:
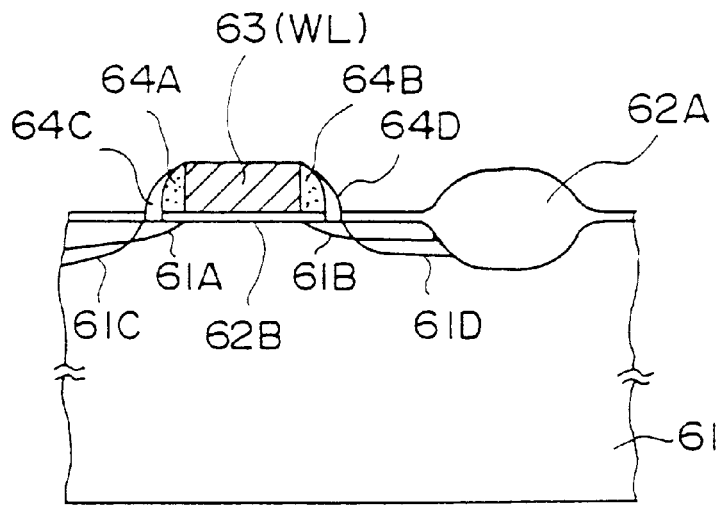

Next, in the step of FIG. 10E, an $SiO_2$ film (not shown) is deposited on the structure of FIG. 10D by a high temperature CVD process, followed by an anisotropic etching process generally perpendicularly to the principal surface of the substrate 61, to form further side wall oxide films 64C and 64D respectively on the laterally outer sides of the side wall oxide films 64A and 64B.

In the step of FIG. 10E, an ion implantation process of $P^+$ or $As^+$ is conducted further into the substrate 61 while using the gate electrode 63 and the side wall oxide films 64A–64D as a self-aligned mask, to form deeper diffusion regions 61C and 61D in the substrate 61, such that the diffusion region 61C overlaps the shallow diffusion region 61A partially and such that the diffusion region 61D overlaps the shallow diffusion region 61B partially. Thereby, an LDD structure is formed similarly to the previous embodiments.

Figure 10F:
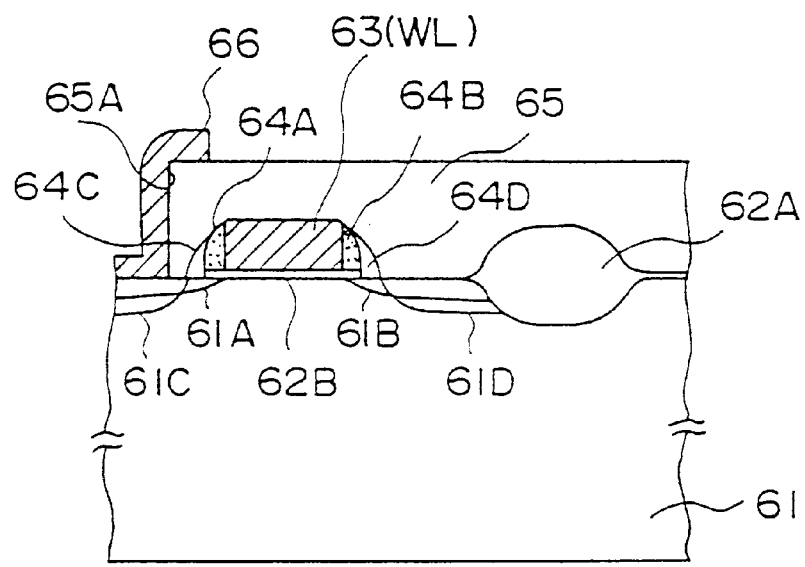

Next, in the step of FIG. 10F, an interlayer insulation film 65 of BPSG, or the like, is deposited on the structure of FIG. 10E by a CVD process, followed by a formation of a contact hole 65A in the interlayer insulation film 65 thus formed, such that the contact hole 65A exposes the diffusion region 61A as well as the diffusion region 61C. After the formation of the contact hole 65A, a wet etching process is applied by using a buffered HF solution for removing a oxide film from the exposed surface of the diffusion region, and an ohmic electrode 66 is provided on the interlayer insulation film 65 such that the ohmic electrode 66 fills the contact hole 65A. Thereby, the ohmic electrode 66 forms a pair of a bit line BL.

Figure 10G:
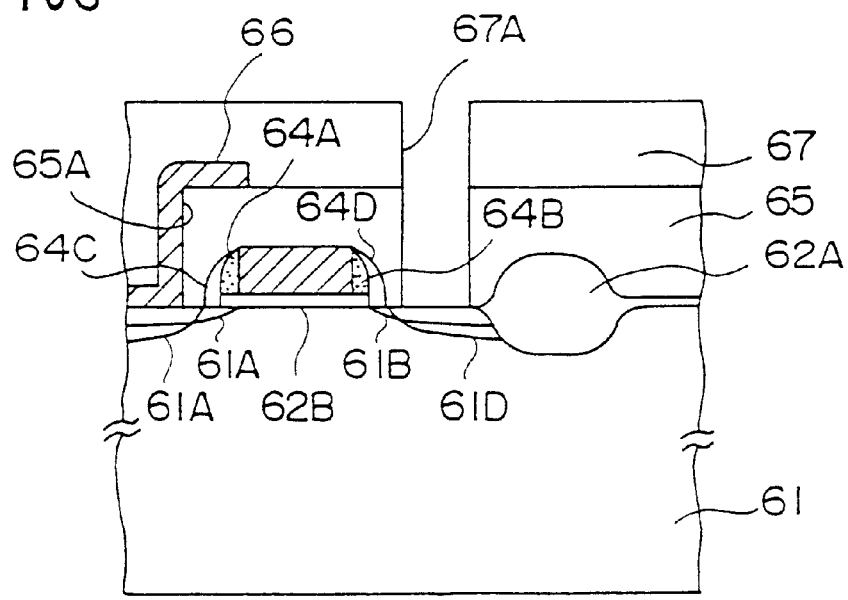

Next, in the step of FIG. 10G, a second interlayer insulation film 67 of BPSG is deposited on the interlayer insulation film 65 of FIG. 10E so as to cover the ohmic electrode 66, and a contact hole 67A is formed such that the contact hole 67A extends through the first and second interlayer insulation films 65 and 67. Thereby, the contact hole 67A exposes the diffusion regions 61B and 61D.

Figure 10H:
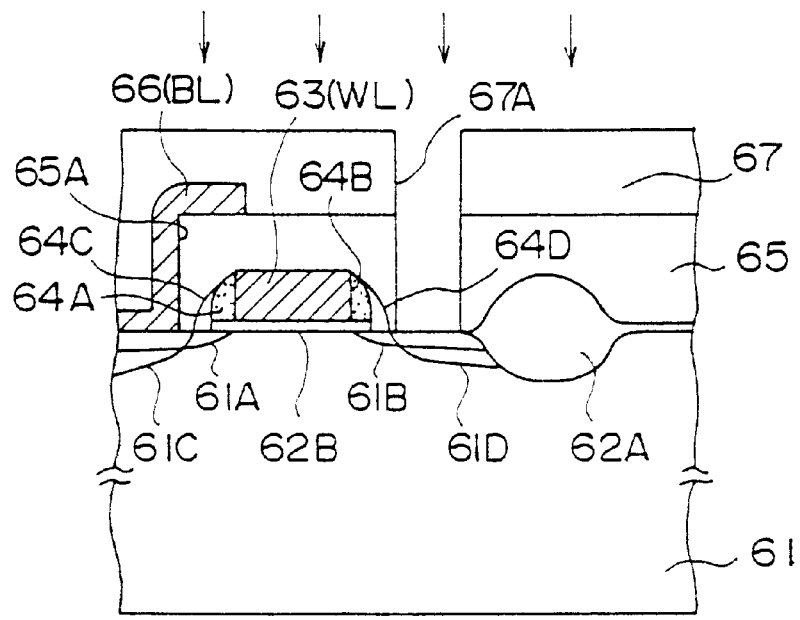

In the present embodiment, the step of FIG. 10H is further conducted for removing a oxide film from the exposed surface of the diffusion regions 61B and 61D by applying a dry cleaning process using a hydrogen plasma through the contact hole 67A. The dry cleaning process may be conducted at a temperature of about 200° C. by exciting an RF plasma in a mixed gas of $H_2$ and a gas containing oxygen such as $H_2O$. For example, a dry cleaning process disclosed in the Japanese Laid-Open Patent Publication 6-140368 may be employed for this purpose.

Figure 10I:
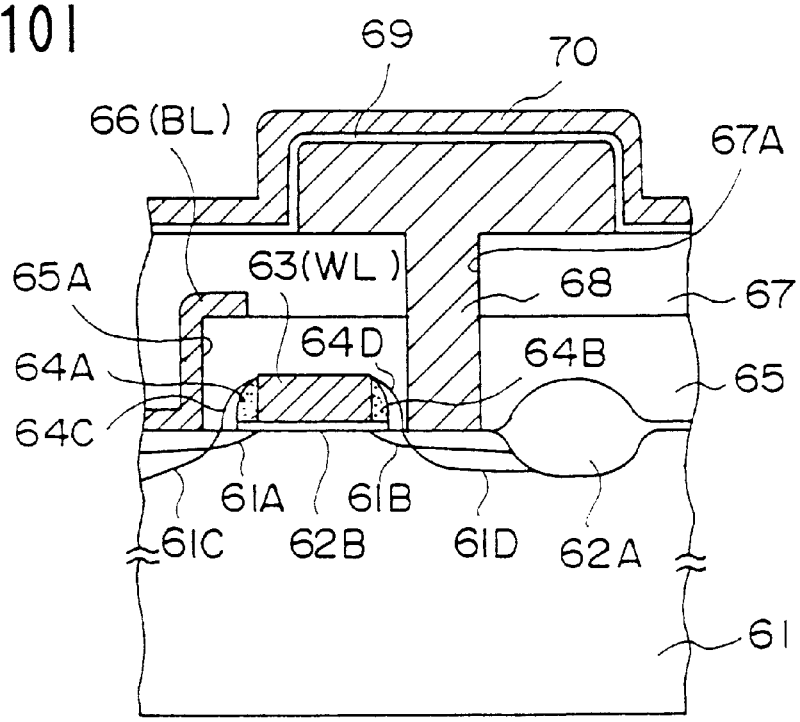

After the dry cleaning process, a step of FIG. 10I is conducted in which a polysilicon electrode 68 constituting the accumulation electrode of a memory cell capacitor is provided in contact with the diffusion regions 61B and 61D such that the polysilicon electrode 68 fills the contact hole 67A. Further, a capacitor dielectric film 69 of SiN is deposited on the electrode 68, followed by a deposition of a polysilicon electrode 70 forming an opposing electrode of the memory cell capacitor on the dielectric film 69. Preferably the SiN film 69 has an ONO structure in which the SiN film is sandwiched by a pair of thin oxide films, similarly to the previous embodiments.

In the DRAM of the present embodiment, the side wall oxide film on the gate electrode 63 is formed of two layers, the first layer 61A or 61B and the second layer 61C or 61D. Thereby, the problem of the leakage current flowing between the gate electrode 63 and the accumulation electrode 68 is effectively eliminated without using a nitride film. As noted already, the surface of the first layer 61A or 61B is annealed in the $N_2O$ atmosphere before the formation of the second layer, at a temperature substantially identical to the substrate temperature used in a high temperature CVD process for depositing an $SiO_2$ film.

In the present embodiment, it should further be noted that the removal of the oxide film is conducted prior to the deposition of the accumulation electrode 68 by applying a dry cleaning process conducted in a hydrogen plasma rather than applying a wet etching process conducted by a buffered HF solution. Thereby, the problem of deterioration of the leakage characteristics associated with the use of the wet etching treatment conducted by the buffered HF solution is successfully avoided.

In the present embodiment, the side wall oxide film is by no means limited to the foregoing two layer construction but may be formed in more than three layers.

Further, the dry cleaning process may be applied in the step of FIG. 10F to the substrate surface exposed by the contact hole 65A for removing a oxide film from the exposed surface of the diffusion regions 61A and 61C, prior to the formation of the bit line electrode 66.

Further, the present invention is not limited to the embodiments described heretofore, but various variations and modifications may be made without departing from the scope of the invention.

What is claimed is:

1. A method of fabricating a semiconductor memory device, comprising the steps of:

forming a gate electrode on a substrate;

forming first and second diffusion regions in said substrate respectively adjacent to first and second side walls of said gate electrode;

forming first and second side wall insulation films respectively on said first and second side walls of said gate electrode;

forming a first interlayer insulation film on said gate electrode such that said first interlayer insulation film covers said first and second side wall insulation films;

forming a first contact hole in said first interlayer insulation film such that said first contact hole exposes said first diffusion region;

forming a bit line pattern on said first interlayer insulation film so as to fill said first contact hole in electrical contact with said first diffusion region;

forming a second interlayer insulation film on said first interlayer insulation film so as to cover said bit line pattern;

forming a second contact hole in said second interlayer insulation film such that said second contact hole penetrates through said first interlayer insulation film and exposes said second diffusion region;

forming an accumulation electrode of a memory cell capacitor such that said accumulation electrode fills said second contact hole and contacts said second diffusion region;

forming a capacitor dielectric film on said accumulation electrode; and forming an opposing electrode on said capacitor dielectric film, wherein said step of forming said first and second side wall insulation films includes the steps of:

depositing a first insulation film on said gate electrode such that said first insulation film covers said first and second side walls of said gate electrode;

applying a first anisotropic etching process proceeding generally perpendicularly to a principal surface of said substrate, to said first insulation film to form first and second lower side wall insulation films, respectively, on said first and second side walls of said gate electrode in an intimate contact therewith;

doping said first and second lower side wall insulation films with N;

depositing a second insulation film on said gate electrode such that said second insulation film covers said first and second lower side wall insulation films; and applying a second anisotropic etching process proceeding generally perpendicularly to said principal surface of said substrate, to said second insulation film to form first and second upper side wall insulation films, respectively, on said first and second lower side wall insulation films.

2. A method as claimed in claim 1, wherein said step of doping said first and second lower side wall insulation films is conducted in an atmosphere containing $N_2O$.

3. The method as claimed in claim 1, further comprising, after said step of forming said first contact hole but before said step of forming said bit line pattern, of applying a dry etching process to an exposed surface of said first diffusion region for removal of an oxide film therefrom.

4. The method as claimed in claim 1, further comprising, after said step of forming said second contact hole but before said step of forming said accumulation electrode, of applying a dry etching process to an exposed surface of said second diffusion region for removal of an oxide film therefrom.

5. The method as claimed in claim 1, further comprising, after said step of forming said first contact hole but before said step of forming said bit line pattern, of applying a dry etching process to an exposed surface of said first diffusion region.

6. The method as claimed in claim 1, further comprising, after said step of forming said second contact hole but before said step of forming said accumulation electrode, of applying a dry etching process to an exposed surface of said second diffusion region.

* * * * *